United States Patent [19]

Stein

[11] Patent Number: 4,539,747
[45] Date of Patent: Sep. 10, 1985

[54] PROCESS FOR MAKING ELECTRICAL CONNECTIONS BETWEEN TWO SURFACES OF A PRINTED CIRCUIT BOARD

[75] Inventor: Helmut Stein, Diekholzen, Fed. Rep. of Germany

[73] Assignee: Robert Bosch GmbH, Stuttgart, Fed. Rep. of Germany

[21] Appl. No.: 522,305

[22] PCT Filed: Feb. 2, 1983

[86] PCT No.: PCT/DE83/00019
§ 371 Date: Jul. 14, 1983
§ 102(e) Date: Jul. 14, 1983

[87] PCT Pub. No.: WO83/03182
PCT Pub. Date: Sep. 15, 1983

[30] Foreign Application Priority Data

Mar. 3, 1982 [DE] Fed. Rep. of Germany ....... 3207585

[51] Int. Cl.³ .............................................. H01K 3/00
[52] U.S. Cl. ..................................... 29/846; 101/170; 174/68.5; 118/401
[58] Field of Search ..................... 29/846; 339/17 LC; 174/68.5; 357/70; 118/401, 243; 101/41, 163, 170

[56] References Cited

U.S. PATENT DOCUMENTS

| 3,324,826 | 6/1967 | Oates | 118/243 |
| 3,589,938 | 6/1971 | Blewett et al. | 118/401 X |
| 3,701,317 | 10/1972 | Miyamoto et al. | 101/170 |
| 4,289,384 | 9/1981 | Samek | 174/68.5 X |
| 4,485,129 | 11/1984 | Grünwald et al. | |

OTHER PUBLICATIONS

IBM Tech. Discl. Bull., vol. 5, No. 11, Apr. 1963, p. 14, by K. J. Roche.
IBM Tech. Discl. Bull., vol. 14, No. 11, Apr. 1972, p. 3232, by L. F. Miller.

Primary Examiner—Mark Rosenbaum
Assistant Examiner—Carl J. Arbes
Attorney, Agent, or Firm—Michael J. Striker

[57] ABSTRACT

A process is suggested for making electrical contacts between the two surfaces (11,12) of a printed circuit board (10), whereby by means of an electrically conductive printed coating conductive ribs (15) are made. The ribs (15) embrace the edge of the printed circuit board (10), thus eliminating the making of apertures in the printed circuit board.

5 Claims, 3 Drawing Figures

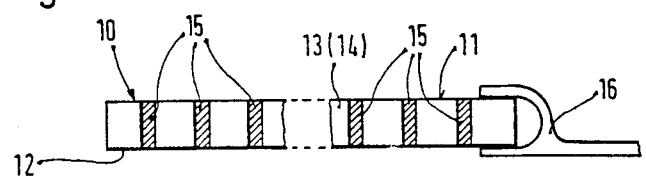
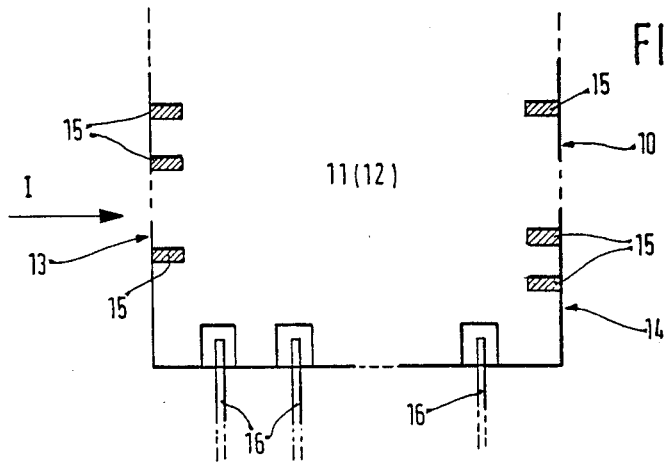
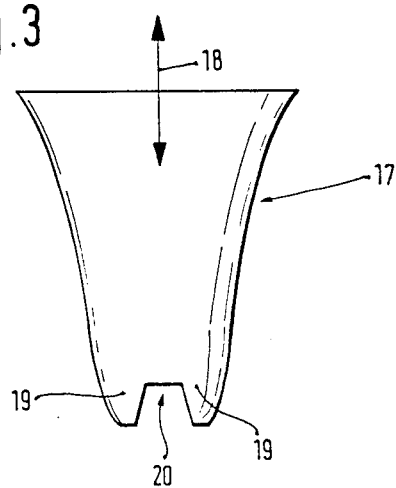

PROCESS FOR MAKING ELECTRICAL CONNECTIONS BETWEEN TWO SURFACES OF A PRINTED CIRCUIT BOARD

BACKGROUND OF THE INVENTION

The invention is based on a process for making electrical connections between the two surfaces of a printed circuit board in accordance with the class of the main claim. Such a process is the subject matter of the associated main patent . . . (patent application No. P 31 45 584.0). The main patent relates to a process wherein the contacting of the printed circuit surfaces occurs through one or a plurality of bores, whereby a conductive paste is printed thereon by means of a deformable printing stamp. In such a process it is necessary to provide accurate bores in the printed circuit board which later are coated with conductive paste by means of the print stamp. The making of the bores in the printed circuit board requires additional operating expense, even then when the subsequent through contacting of the bores is carried out in a particulary simple and advantageous manner.

Known methods for electrical contacting of the two surfaces of printed circuit boards use either bores which are penetrated by an electrically conductive part or are provided with an electrically conductive metallization, or in a still more expensive operating process, whereby electrical connecting bridges are soldered onto the surfaces. These known processes require a considerable finishing technique expense and are therefore not cost effective.

SUMMARY OF THE INVENTION

The process in accordance with the invention with the characterizing features of the main claim permits in a particularly simple and effective manner to connect the two surfaces of a printed circuit board or concentrated area or individual conductive paths on the different surfaces of the printed circuit board without requiring expensive treatments of the printed circuit board. The process in accordance with the invention permits an exact positioning of the electrical connections with a minimum expense for material with respect to known processes, so that in addition to the finishing technique savings and improvement, advantages are obtained by lowering the expenses for the material.

Due to the stated measures in the subclaims, effective further developments and improvements of the process stated in the main claim are possible. In particular, the printing of a plurality of electrically conductive ribs permits a particularly economical connection of different areas or conductive paths on the opposite surfaces of the printed circuit board. In this manner a plurality of different connections can be made simultaneously in a particularly simple manner without the necessity of any previous operating step.

BRIEF DESCRIPTION OF THE DRAWINGS

The invention is schematically illustrated in the drawing and is explained in more detail in the following description.

FIG. 1 shows a view in direction of arrow I in FIG. 2.

FIG. 2 is a plan view of a printed circuit board and

FIG. 3 is a simplified illustration of the elastic deformable printing stamp.

DETAILED DESCRIPTION OF THE PREFERRED EMBODIMENTS

FIG. 1 shows a schematic illustration, seen in direction of arrow I in FIG. 2. Therein reference numeral 10 designates a printed circuit board, its upper side has the reference numeral 11 and its lower side the reference numeral 12. Electrically conductive ribs 15 are provided on front faces 13 and 14 which connect the upper side 11 with the lower side 12. Conductive paths, areal electrically conductive layers or the like, which are not shown, may be disposed between the individual ribs 15. The reference numeral 16 designates a connecting part of a connecting element which engages on the front face of a printed circuit board 10 which is not occupied by the ribs 15.

The plan view shown in FIG. 2 of the printed circuit board 10 shows that the ribs 15 embrace the upper side 11 and also the lower side 12 of the printed circuit board, which cannot be seen in the drawing, so that the ribs can be easily contacted on the printed circuit board with conductive paths, not shown. The connecting elements 16 form a comb like connecting bar which engages on the front side of the printed circuit board not occupied by the ribs 15.

FIG. 3 schematically illustrates a printing stamp 17 which during the printing of a conductive paste moves reciprocally in the direction of arrow 18 in the area of ribs 15. Lips 19 embrace a trapezoidal recess 20 on the lower side of the printing stamp 17. When exerting a pressure on the stamp 17 in the direction of recess 20, the stamp, which is made of an elastic material, for example, silicon rubber, is deformed, so that the lips 19 engage on a printed circuit board which extends into the recess 20, thus printing the parts of the ribs 15 which cover the upper side 11 and the lower side 12. For receiving the electrically conductive printing paste, the stamp with the recess 20 is pushed onto a stereotype plate on which the conductive paste was previously applied.

Due to the suggested process a particular advantageous and economical possibility is obtained for making electrical connections between the upper side 11 and the lower side 12 of a printed circuit board 10, so that both printed circuit boards can be used for switching without expensive measures for the making of the electrical connections between the two sides of the printed circuit board. The conductive paste used for printing ribs 15 is commercially available, as conductive substances it contains preferably gold, silver, palladium, but also base metals like copper, nickel or aluminum as well as carbon. The printed paste receives its mechanical and electrical stability by means of a sintering process which in ceramic carriers is carried out preferably at about 850° C., and in epoxy resin printed circuit boards at about 200° C. In addition to the aforementioned pastes, further suitable materials are obtainable as thick layer pastes in commerce.

With the process in accordance with the invention it is possible to connect in one operating step the two surfaces of a printed circuit board 10 by means of a printed layer which embraces the edge of the printed circuit board, without any expensive preparatory work. Thereby, two opposite front faces 13, 14 of printed circuit board 10 can be simultaneously printed in one printing operation together with the ribs 15, for example. Simultaneously with the printing process, the electrical connections are made with conductive paths, not shown, whereby the process further increases the economical aspect.

I claim:

1. Process for making electrical connections between an upper surface and a lower surface connected by side surfaces of a printed circuit board having edges, the process comprising the steps of: providing an elastically deformable printing stamp having a portion capable of embracing an edge of the printed circuit board in a direct contact with the upper surface, the lower surface and a side surface connecting the upper and lower surfaces in the region of an edge; providing an electrically conductive coating material on said embracing portion of said printing stamp; and directly contacting said embracing portion with the upper surface, the lower surface and a side surface connecting the upper and lower surfaces in the region at least one of the edges of the circuit board so as to cause printing of the electrically conductive coating in selected positions on of said upper, lower and side surfaces in the region of at least one of the edges of the circuit board so as to connect electrically said upper and lower surfaces of the printed circuit board.

2. Process as defined in claim 1, wherein said contacting step includes printing simultaneously in one operating step on two opposite edges of the printed circuit board.

3. Process as defined in claim 1, wherein said printing step includes printing of said electrically conductive coating so as to form a plurality of small ribs.

4. Process as defined in claim 3, wherein said rib forming includes forming such ribs which connect different conductive paths on the surfaces of the printed circuit board.

5. Process as defined in claim 1, wherein said providing step includes forming said embracing portion of said printing stamp with a U-shaped to trapezoidal-like opening defining lip-like protrusions capable of pressing against the printed circuit board surfaces due to deforming of said stamp.

* * * * *